(12) United States Patent
Shiina

(10) Patent No.: US 11,482,976 B2
(45) Date of Patent: Oct. 25, 2022

(54) DIFFERENTIAL AMPLIFIER

(71) Applicant: ABLIC Inc., Tokyo (JP)

(72) Inventor: Yoshiomi Shiina, Tokyo (JP)

(73) Assignee: ABLIC INC., Tokyo (JP)

( * ) Notice: Subject to any disclaimer, the term of this patent is extended or adjusted under 35 U.S.C. 154(b) by 0 days.

(21) Appl. No.: 17/160,755

(22) Filed: Jan. 28, 2021

(65) Prior Publication Data

US 2021/0250005 A1 Aug. 12, 2021

(30) Foreign Application Priority Data

Feb. 7, 2020 (JP) .............................. JP2020-019244

(51) Int. Cl.
*H03F 3/45* (2006.01)
(52) U.S. Cl.
CPC ..................... *H03F 3/45183* (2013.01); *H03F 2203/45026* (2013.01); *H03F 2203/45508* (2013.01)
(58) Field of Classification Search
CPC .......... G05F 1/575; G05F 1/571; G05F 1/569; H03F 3/45269; H03F 1/523; H03F 3/45192; H03F 2203/45026

USPC .................................................. 330/252–261
See application file for complete search history.

(56) References Cited

U.S. PATENT DOCUMENTS 5,808,513 A * 9/1998 Archer ................ H03F 3/45192
330/253

FOREIGN PATENT DOCUMENTS

JP H11-041037 A 2/1999

\* cited by examiner

*Primary Examiner* — Khanh V Nguyen
*Assistant Examiner* — Khiem D Nguyen
(74) *Attorney, Agent, or Firm* — Crowell & Moring LLP

(57) ABSTRACT

A differential amplifier includes first and second MOS transistors of a first conductivity type which constitute a differential input circuit, a bias current source which supplies a bias current to the first and second MOS transistors, and a third MOS transistor of the first conductivity type provided between the bias current source and the first and second MOS transistors and constituted to limit a back-gate voltage of the first and second MOS transistors.

8 Claims, 3 Drawing Sheets

DIFFERENTIAL AMPLIFIER

RELATED APPLICATIONS

This application claims priority to Japanese Patent Application No. 2020-019244, filed on Feb. 7, 2020, the entire content of which is incorporated herein by reference.

BACKGROUND OF THE INVENTION

1. Field of the Invention

The present invention relates to a differential amplifier.

2. Description of the Related Art

FIG. 3 is a circuit diagram illustrating a conventional differential amplifier.

The conventional differential amplifier includes PMOS transistors 31 and 32 which constitute a differential input circuit, NMOS transistors 33 and 34 which act as loads, a constant current source 35 which is a bias current source, and an NMOS transistor 36. The NMOS transistor 36 limits the voltage between the back-gate and the source of the PMOS transistors 31 and 32.

As described above, since the differential amplifier includes the NMOS transistor 36, the voltage between the back-gate and the source of the PMOS transistors 31 and 32 becomes a gate-source voltage of the NMOS transistor 36 even if a high voltage is set as a power supply voltage, thus causing decrease in mutual conductance of the PMOS transistor 31 no more than necessary, which allows suppression of an increase in offset voltage while securing a wide in-phase input voltage range (refer to, for example, Japanese Patent Application Laid-Open No. H11(1999)-41037).

SUMMARY OF THE INVENTION

However, since the conventional differential amplifier has the diode-connected NMOS transistor 36, the power supply voltage needs to have a voltage higher than a voltage obtained by adding the gate-source voltages of the PMOS transistors 31 and 32 and the gate-source voltage of the NMOS transistor 36. That is, low voltage operation in the conventional differential amplifier is difficult.

The present invention aims to provide a differential amplifier capable of operating at a low voltage while securing a wide in-phase input voltage range.

According to one aspect of the present invention, there is provided a differential amplifier which includes first and second MOS transistors of a first conductivity type which constitute a differential input circuit, a bias current source which supplies a bias current to the first and second MOS transistors, and a third MOS transistor of a first conductivity type provided between the bias current source and the first and second MOS transistors and constituted to limit a back-gate voltage of the first and second MOS transistors.

The differential amplifier of the present invention, accordingly, can operate at a low voltage while securing a wide in-phase input voltage range.

DETAILED DESCRIPTION OF THE PREFERRED EMBODIMENTS

Hereinafter embodiments of the present invention are explained along with accompanying drawings.

Figure 1:
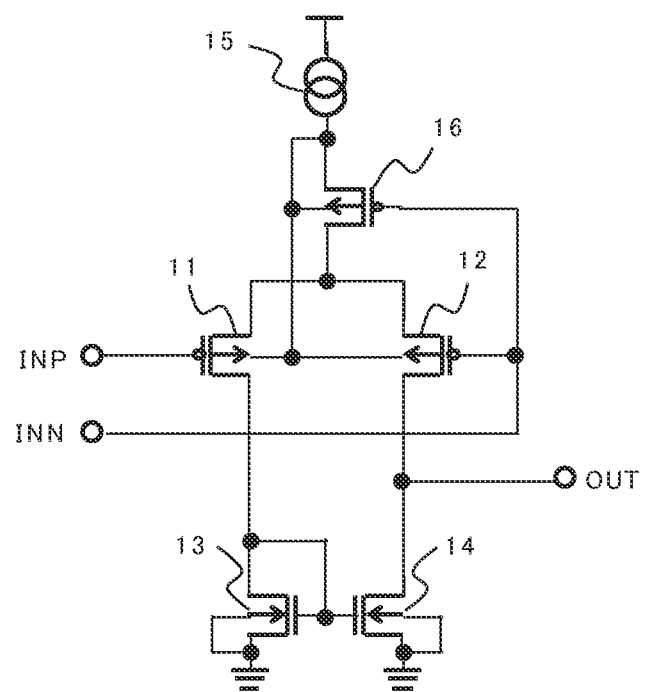
FIG. 1 is a circuit diagram illustrating a differential amplifier according to an embodiment of the present invention.

FIG. 1 is a circuit diagram illustrating a differential amplifier according to an embodiment of the present invention.

The differential amplifier according to the present embodiment includes PMOS transistors 11 and 12 which constitute a differential input circuit, NMOS transistors 13 and 14 which act as loads, a constant current source 15 which is a bias current source, and a PMOS transistor 16.

The PMOS transistor 16 has a source and a back-gate connected to the constant current source 15, and a gate connected to an input terminal of the differential amplifier, e.g., an input terminal INN. The PMOS transistor 11 has a source connected to a drain of the PMOS transistor 16, a gate connected to an input terminal INP, and a back-gate connected to the constant current source 15. The PMOS transistor 12 has a source connected to the drain of the PMOS transistor 16, a gate connected to the input terminal INN, and a back-gate connected to the constant current source 15. The NMOS transistor 13 has a gate and a drain connected to a drain of the PMOS transistor 11, and a source and a back-gate connected to a ground terminal. The NMOS transistor 14 has a gate connected to the gate of the NMOS transistor 13, a drain connected to a drain of the PMOS transistor 12 and an output terminal OUT, and a source and a back-gate connected to the ground terminal.

A description will hereinafter be made of operation of the differential amplifier constituted as described above.

Since the PMOS transistor 16 has the gate connected to the input terminal INN of the differential amplifier, the voltage of the back-gate of the PMOS transistor 16 connected to the source thereof becomes a value obtained by adding the voltage between the gate and source thereof to the voltage of the input terminal INN. Further, since the PMOS transistor 16 has the source to which the back-gates of the PMOS transistors 11 and 12 are connected, the PMOS transistor 16 limits the voltage between the back-gates and sources of the PMOS transistors 11 and 12. That is, the voltage of the back-gate of each of the PMOS transistors 11 and 12 becomes the value obtained by adding the gate-source voltage of the PMOS transistor 16 to the voltage of the input terminal.

Here, the size of the PMOS transistor 16 is set so that the gate-source voltage is higher than that of each of the PMOS transistors 11 and 12. For example, the gate length L of the PMOS transistor 16 is set larger than those of the PMOS transistors 11 and 12.

Since the potential at the back-gate of the PMOS transistors 11 and 12 become high by the manner the PMOS transistor 16 is constituted as described above, it is possible to extend the in-phase input voltage range by the back-gate effect. Further, since the power supply voltage needs to be higher than the gate-source voltage of the PMOS transistor 16, the differential amplifier can operate at a voltage lower than the conventional differential amplifier.

As described above, according to the differential amplifier of the present invention, since the circuit which limits the voltage between the back-gate and the source of each PMOS transistor constituting the differential input circuit includes the PMOS transistor whose gate is connected to the input terminal and whose gate-source voltage is higher than that of the PMOS transistors constituting the differential input circuit, the differential amplifier can operate at a low voltage while securing a wide in-phase input voltage range.

Figure 2:
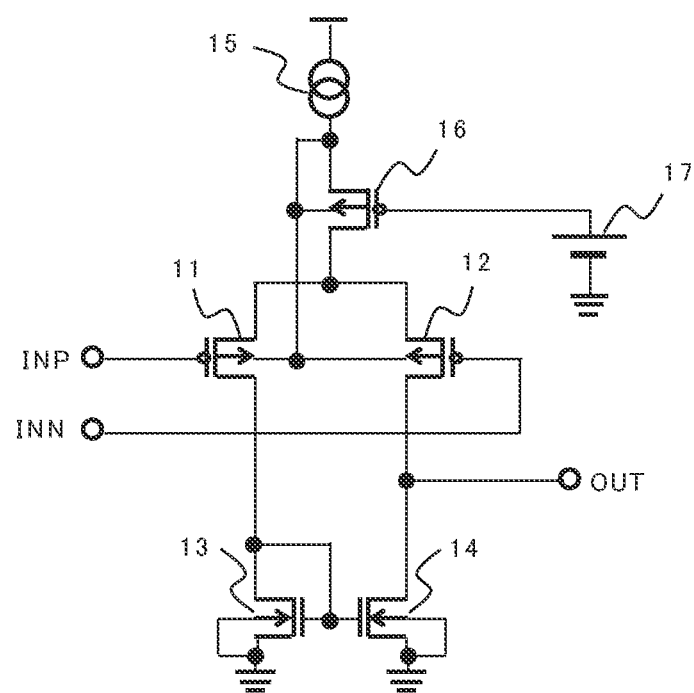
FIG. 2 is a circuit diagram illustrating another example of the differential amplifier according to the embodiment of the present invention.
Figure 3:
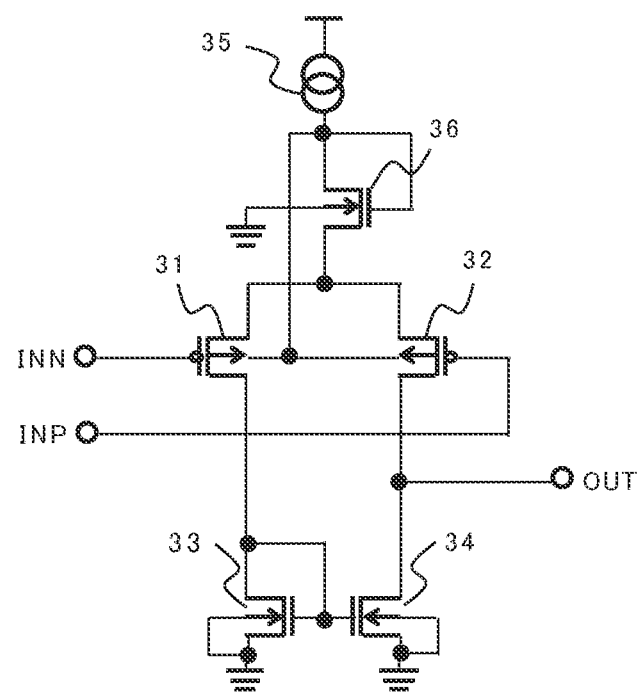
FIG. 3 is a circuit diagram illustrating a conventional differential amplifier.

FIG. 2 is a circuit diagram illustrating another example of the differential amplifier according to the embodiment of the present invention.

The differential amplifier of FIG. 2 is additionally provided with a constant voltage source 17 connected to the gate of the PMOS transistor 16 as seen from FIG. 1. The constant voltage source 17 applies a bias voltage to the gate of the PMOS transistor 16.

Upon setting the bias voltage of the constant voltage source 17 higher than the voltage of the input terminal, the gate-source voltage of the PMOS transistor 16 becomes higher than the gate-source voltage of each of the PMOS transistors 11 and 12. With this, setting the bias voltage of the constant voltage source 17 to an appropriate value enables the PMOS transistor 16 to be constituted with the same size as the PMOS transistors 11 and 12.

That is, by setting the bias voltage of the constant voltage source 17 to the appropriate value, the differential amplifier of FIG. 2 is capable of obtaining the same effect as the differential amplifier of FIG. 1 even if the PMOS transistor 16 is constituted with the same size as the PMOS transistors 11 and 12.

Although the embodiments of the present invention have been described above, the present invention is not limited to the above embodiments. Various changes can be made thereto within the scope not departing from the spirit of the present invention.

For example, in the present embodiment, although the differential amplifier has been described as the circuit in which the PMOS transistors constitute the differential input circuit, and the PMOS transistor limits the voltage between the back-gate and the source, it may be constituted as a circuit in which NMOS transistors constitute the differential input circuit and an NMOS transistor limits the voltage between the back-gate and the source. The differential amplifier in that case is constituted so that the circuit is inverted in a relationship between a power supply terminal and a ground terminal.

What is claimed is:

1. A differential amplifier comprising:
   first and second MOS transistors of a first conductivity type which constitute a differential input circuit;
   a bias current source configured to supply a bias current to the first and second MOS transistors; and
   a third MOS transistor of the first conductivity type provided between the bias current source and the first and second MOS transistors and configured to limit a back-gate voltage of the first and second MOS transistors,
   wherein the third MOS transistor has a gate directly connected to a gate of one of the first and second MOS transistors.

2. The differential amplifier according to claim 1, wherein the third MOS transistor has a gate-source voltage higher than gate-source voltages of the first and second MOS transistors.

3. A differential amplifier comprising:
   first and second MOS transistors of a first conductivity type which constitute a differential input circuit;
   a bias current source configured to supply a bias current to the first and second MOS transistors;
   a third MOS transistor of the first conductivity type provided between the bias current source and the first and second MOS transistors and configured to limit a back-gate voltage of the first and second MOS transistors; and
   a constant voltage source directly connected to a gate of the third MOS transistor and configured to supply the gate of the third MOS transistor wherein the third MOS transistor has a gate supplied with a bias voltage higher than voltages applied to input terminals of the differential input circuit.

4. The differential amplifier according to claim 3, wherein a back-gate of the third MOS transistor is directly connected to a source of the third MOS transistor.

5. The differential amplifier according to claim 4, wherein the third MOS transistor is a PMOS transistor.

6. The differential amplifier according to claim 1, wherein a back-gate of the third MOS transistor is directly connected to a source of the third MOS transistor.

7. The differential amplifier according to claim 6, wherein the third MOS transistor is a PMOS transistor.

8. The differential amplifier according to claim 1, wherein a gate length of the third MOS transistor is larger than a gate length of each of the first and second MOS transistors.

* * * * *